Dec. 1, 1970 R. P. McLEROY 3,544,866
ELECTRONIC DRIVE CIRCUITRY FOR ULTRASONIC DEVICES
Filed Oct. 16, 1969
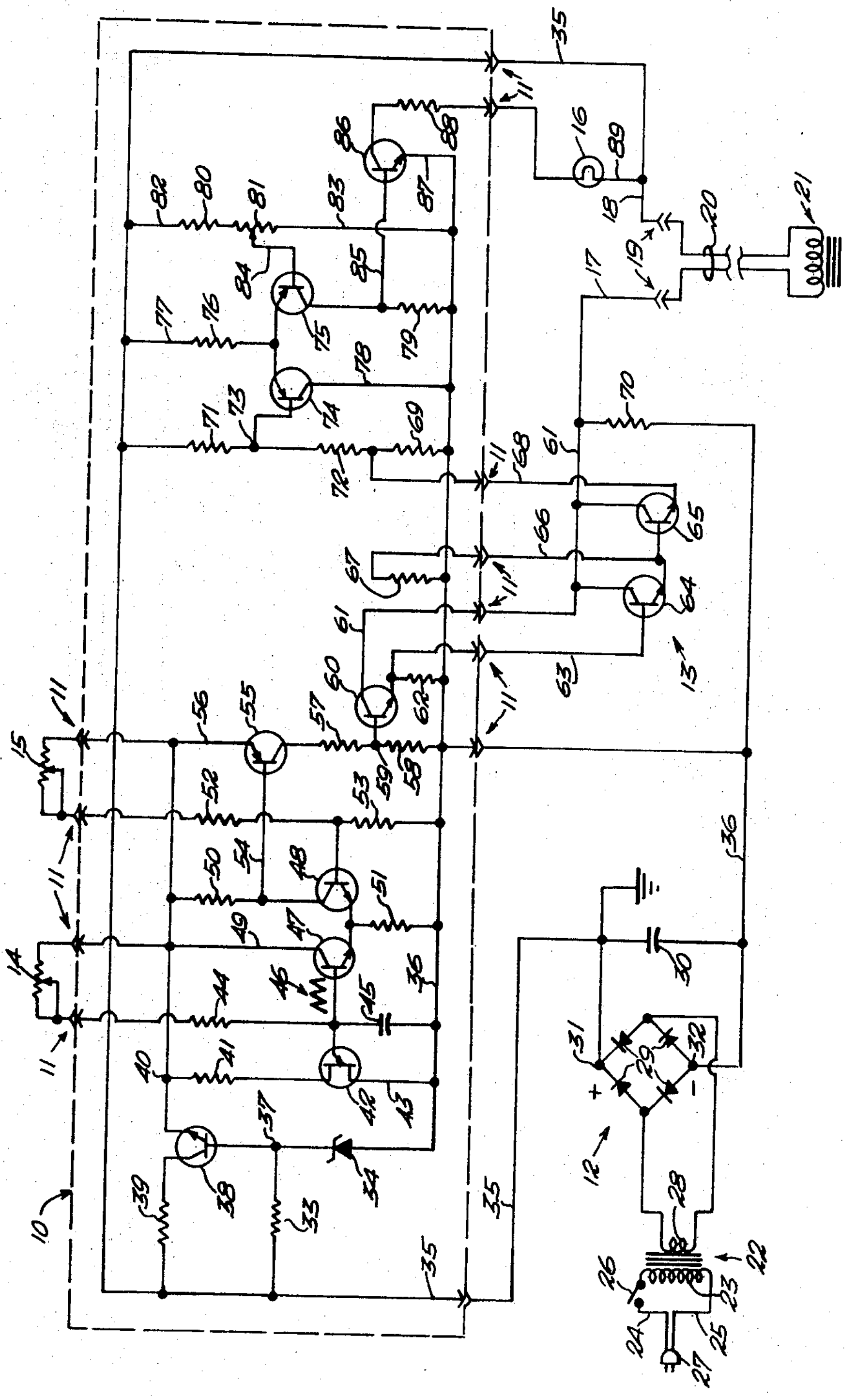
INVENTOR
ROBERT P. McLEROY
BY Ernest H. Schmidt
ATTORNEY United States Patent Office 3,544,866

Patented Dec. 1, 1970

3,544,866
ELECTRONIC DRIVE CIRCUITRY FOR ULTRASONIC DEVICES

Robert P. McLeroy, Miramar, Fla., assignor to C & B Corporation, a corporation of Florida Filed Oct. 16, 1969, Ser. No. 866,996
Int. Cl. H01v *9/00*
U.S. Cl. 318—118 8 Claims

ABSTRACT OF THE DISCLOSURE

Solid state electronic circuitry for driving the magnetostrictive transducer of ultrasonic dental tools is described, wherein the power output to the tool is controlled by variation of the duty cycle rather than the amplitude of the ultrasonic output signal. Variation in duty cycle is achieved in a differential comparator stage which transforms the sawtooth input from an RC relaxation oscillator into a signal voltage of substantially square waveform of variable pulse width or duty cycle, which square waveform is amplified in a power amplifier to drive the magnetostrictive transducer.

The use of dental tooth-cleaning tools including a magnetostrictive transducer operative at ultrasonic frequencies and connected to the tool tip supplied with a coolant such as water is known. Reference can be had to U.S. Pat. No. 3,368,280, issued Feb. 13, 1968, to C. M. Friedman et al., titled Dental Tool, for a detailed description thereof. It is the principal object of this invention to provide novel and improved solid state electronic circuitry for driving the magnetostrictive transducer of such ultrasonic dental tools.

Drive circuitry for ultrasonic dental tools ordinarily includes means for varying the power output to the tool in accordance with requirements of the dental procedure being undertaken. Such output control has heretofore consisted of electrical means for varying the amplitude of the output drive signal. It is the principal object of this invention to provide improved and more efficient drive circuitry wherein the power output to the ultrasonic magnetostrictive transducer of the dental tool is controlled by variation of the duty cycle of the ultrasonic frequency signal, rather than by variation of its amplitude.

In order to effect proper and efficient operation of ultrasonic dental tools, it is, of course, necessary that the electronic drive circuitry be precisely tuned to the resonant frequency of the magnetostrictive transducer in the instrument. Heretofore, this has been accomplished by observation of the tool tip or probe for maximum activity, particularly with respect to dispersal of the activated coolant, while adjusting a frequency control element comprising the electrical drive circuitry. Such tuning, while suitable for sight tuning or matching of the drive output to the instrument, not only is time-consuming, but also imprecise. It is, accordingly, another object of this invention to provide a drive circuit of the character described including visual tuning means in the form of a signal lamp or the like, the brightness of which will be indicative of tuning accuracy.

It is still another object of the invention to provide an electronic drive circuit or power supply for ultrasonic dental tools which will be simple in construction, compact, inexpensive to manufacture, efficient in operation, and dependable and durable in use. Other objects, features and advantages of the invention will be apparent from the following description when read with reference to the accompanying schematic diagram of the electronic drive circuitry comprising the invention.

Referring now to the schematic diagram, the broken line rectangular enclosure 10 designates a circuit component board upon which the circumscribed circuit elements, being the smaller circuit elements hereinafter more particularly described, are mounted and interconnected. The double arrows about the periphery of the component board 10, designated by reference numeral 11, indicate plug-in jack assemblies by means of which the circuitry of said component board may be removably assembled and electrically interconnected with the remainder of the circuitry, all of which will be housed in a suitable chassis. The circuitry also includes a D.C. power supply, indicated generally at 12, a power amplifier, indicated generally at 13, a variable resistor frequency control element 14, a variable resistor power output control element 15 and a tuning indicator lamp 16, all of which will preferably be mounted in the common chassis into which the component board 10 is plugged. Reference numerals 17 and 18 indicate the power output signal leads in the chassis, which terminate in a receptacle or jack 19 connectable through a flexible cable 20 to the magnetostrictive transducer 21 in the ultrasonic dental tool (not further illustrated herein).

Considering now, in detail, the operation of the electronic circuitry, numeral 22 designates the power input transformer of the power supply 12, the primary winding 23 of which is connected, through power leads 24, 25 in series with an off-on switch 26, to an electrical plug 27 for plug-in connection to a receptacle outlet of an ordinary 115-volt, 60-cycle source of electrical supply, for example. The reduced voltage output derived from the secondary winding 28 of the power input transformer 22 is applied to the input of a full-wave rectifier comprising four diodes 29 interconnected in an ordinary full-wave bridge circuit. The D.C. output of the bridge rectifier is shunted by a voltage smoothing capacitor 30 to provide an unregulated D.C. supply voltage between the terminal points indicated at 31 and 32 of the bridge circuit.

The D.C. output appearing between the points 31 and 32 is connected across a series-type voltage regulator comprising series resistor 33 and "Zener" diode 34 through conductors 35 and 36 to provide a reference voltage of approximately 15 volts D.C. appearing with respect to common negative potential at point 37, which reference voltage is applied to the base of an emitter follower regulator transistor 38, the collector element of which is connected to the unregulated source of D.C. supply voltage through a low-value resistor 39.

The regulated output voltage of approximately 15 volts appearing at the emitter of the transistor 38 indicated at circuit point or junction 40, is connected through current-limiting resistor 41 to one base of a unijunction transistor 42, the other base being returned through conductor 43 to common negative potential. The unijunction transistor 42 is utilized as a relaxation oscillator to provide the ultrasonic signal or voltage which is amplified and varied in frequency as hereinafter described to energize the magnetostrictive transducer 21. To this end, an RC circuit comprising variable resistor 14 in series with fixed resistor 44, and capacitor 45, is provided, said resistors being in series between the source of regulated D.C. voltage supply and the emitter element of the unijunction transistor 42, and said capacitor being connected between said emitter element and common negative potential. The output of the emitter element of the unijunction transistor element 42 is of sawtooth waveform, as indicated at 46, which output signal can be varied in frequency, for example within a frequency range of between 16.5 and 21 kilocycles, by adjustment of the frequency control or tuning variable resistor or potentiometer 14. This variable sawtooth signal or waveform is fed directly into the base element of a transistor 47 which, together with the transistor 48, comprises a differential comparator stage for transforming said sawtooth signal into a signal voltage of substantially square waveform of variable pulse width or duty cycle.

The collector element of the transistor 47 is connected directly to the regulated source of D.C. supply voltage through conductor 49, and the collector element of transister 48 is connected to said source of supply through a load resistor 50 The emitter elements of transistor 47 and 48 are returned to common negative potential through a common bias resistor 51. A voltage divider circuit including variable resistor or potentiomer 15, and resistors 52 and 53 connected in series across the regulated source of D.C. voltage supply, provide a reference voltage at the junction between said resistors 52 and 53 which is applied directly to the base element of the output transistor 48. The voltage divider resistors 15, 52, and 52 and 53, and the bias resistor 51, are so chosen that the clipped squarewave output appearing across the load resistor 50 (at the frequency determined by the setting of the frequency control resistor, as described above) can be varied over a three-to-one range in duty cycle by adjustment of the variable resistor 15 to provide a wide range of power output control.

The output of the differential comparator output transistor 48 is fed through conductor 54 to the base element of common emitter transistor 55 comprising a voltage amplifier-buffer stage. The emitter element of the transistor 55 is connected to the source of regulated D.C. supply voltage through conductor 56 and the collector element thereof is returned to common negative potential through series bias resistors 57 and 58 which, at their junction point 59, provide a low impedance output signal for driving the base element of a common collector connected transistor 60 utilized as a current amplifier stage. The collector element of the transistor 60 is returned to the unregulated source of D.C. voltage supply through conductor 61, series-connected magnetostrictive transducer 21 and conductor 35. The transistor 60 is biased by a bias resistor 62 connected between its emitter element and common negative potential. The current amplifier output signal of the transistor 60 appearing at its emitter element is fed through conductor 63 to the base element of the first transistor 64 constituting the driver of a two-stage series-connected power amplifier including output transistor 65. The emitter element of the driver transistor 64 is returned to common negative potential through conductor 66 and bias resistor 67. The emitter element of the power output transistor 65 is returned to common negative potential through conductor 68 and bias resistor 69. The collector elements of each of the transistors 64 and 65 are connected to the load comprising the magnetostrictive transducer 21 through a conductor 61, flexible cable 20 and conductor 35 leading to the unregulated source of D.C. voltage supply. A magnetic bias resistor 70 shunted between the load side of the magnetostrictive transducer 21 and common negative potential provides a bias current through said transducer at all times when the output transistor 65 is non-conducting to insure efficient operation of said transducer along the straight-line portion of its saturation curve.

Electronic means is provided to vary the energizing current applied to the tuning indicator lamp 16 in accordance with accuracy of tuning, that is, to achieve the maximum brilliance of said lamp upon adjusting for maximum current through the transistor 21, indicative of resonance. To this end, series-connected voltage divider resistors 71 and 72 are connected in series with power output bias resistor 69 across the unregulated source of D.C. supply voltage to provide a reference voltage appearing at junction point 73 between voltage divider resistors 71 and 72 which will be proportional to the current flowing through said output bias resistor, said current, in turn, being proportional to the excitation current flowing through the transducer 21. The reference voltage appearing at junction point 73 is fed directly to the base element of a transistor 74 which, together with a companion transistor 75, comprise a differential amplifier stage. The emitter elements of the transistors 74 and 75 are joined together and biased by a common bias resistor 76 returned to the unregulated source of D.C. voltage supply through conductors 77 and 35. The collector element of transistor 74 is connected directly to common negative potential through conductor 78, and the collector element of transistor 75 is connected to common negative potential through load resistor 79. The differential amplifier comprising transistors 74 and 75 compares the variable reference voltage appearing at the input junction point 73 with a preset voltage obtained from a voltage divider circuit comprising series-connected resistor 80 and potentiometer 81 connected across the unregulated source of D.C. voltage supply through conductors 82 and 83. This preset voltage appearing at the potentiometer contactor arm is fed directly to the base element of transistor 75 through conductor 84. The varying output voltage of the output transistor 75 of the differential amplifier appearing at the collector element end of the output resistor 79 is fed through conductor 85 directly to the base element of a current amplifier stage comprising common emitter connected transistor 86. The emitter element of the current amplifier or drive transistor 86 is returned to common negative potential through conductor 87, and the output signal appearing at the collector element of said transistor is fed in series through current-limiting load resistor 88 to the tuning indicator lamp 16, said tuning lamp indicator being returned to the unregulated source of D.C. supply voltage through conductor 89.

In operation, circuit parameters and component values are so chosen, particularly with respect to the positional adjustment of the potentiometer 81 (which, once set, will thereafter not ordinarily be disturbed), as to provide for maximum brilliance of the tuning indicator lamp 16 upon effecting maximum current through power output bias resistor 69, that is, upon achieving resonance or maximum efficiency of operation of the transducer.

While I have illustrated and described herein only one form in which the invention can conveniently be embodied in practice, it is to be understood that this form is presented by way of example only and not in a limiting sense. The invention, in brief, comprises all the embodimets and modifications coming within the scope and spirit of the following claims.

What I claim is new and desire to secure by Letters Patent is:

1. Electronic drive circuitry for exciting a magnetostrictive transducer used in ultrasonic dental tools and the like comprising, in combination, a source of D.C. potential, a solid state ultrasonic oscillator energized by said source of D.C. potential and providing a substantially sawtooth waveform output signal voltage, solid state circuit means energized by said source of D.C. potential and having an input controlled by said output signal voltage and providing a second output signal voltage of substantially square waveform, said circuit means including means for varying the duty cycle of said second output signal voltage, a power amplifier providing a power output signal of substantially square waveform and variable duty cycle, and an ultrasonic transducer energized as the load of said power output signal.

2. Electronic drive circuitry for exciting a magnetostrictive transducer used in ultrasonic dental tools and the like, as defined in claim 1, wherein said oscillator is in the form of an RC relaxation circuit.

3. Electronic drive circuitry for exciting a magnetostrictive transducer, as defined in claim 2, wherein said RC relaxation circuit comprises a unijunction transistor.

4. Electronic drive circuitry for exciting a magnetostrictive transducer, as defined in claim 2, wherein said RC relaxation circuit comprises means for varying the frequency of said sawtooth waveform output.

5. Electronic drive circuitry for exciting a magnetostrictive transducer, as defined in claim 4, wherein said sawtooth waveform output is variable within a frequency range of between 16.5 and 21 kilocycles.

6. Electronic drive circuitry for exciting a magnetostrictive transducer, as defined in claim 2, wherein said substantially square waveform solid state circuit means comprises a differential comparator stage.

7. Electronic drive circuitry for exciting a magnetostrictive transducer, as defined in claim 4, wherein said differential comparator stage comprises an input transistor and an output transistor, said input signal voltage being fed to the input of said input transistor, a D.C. reference voltage applied to a controlling element of said second transistor, and a load resistor for said second transistor providing said second output signal, said means for varying said duty cycle comprising means for varying said reference voltage.

8. Electronic drive circuitry for exciting a magnetostrictive transducer, as defined in claim 7, wherein said means for varying said reference voltage comprises a voltage divider circuit connected across said source of D.C. potential.

References Cited

UNITED STATES PATENTS

| | | | |
|---|---|---|---|
| 2,105,479 | 1/1938 | Hayes | 318—118 X |
| 3,152,295 | 10/1964 | Schebler | 318—118 |
| 3,447,051 | 5/1969 | Attwood et al. | 318—118 X |

DONOVAN F. DUGGAN, Primary Examiner

U.S. Cl. X.R.

310—26